(12) United States Patent
Brennan

(10) Patent No.: US 9,467,303 B2
(45) Date of Patent: Oct. 11, 2016

(54) CONTROLLER AREA NETWORK BUS TRANSMITTER WITH COMPLEMENTARY SOURCE FOLLOWER DRIVER

(71) Applicant: Linear Technology Corporation, Milpitas, CA (US)

(72) Inventor: Ciaran Brennan, Essex Junction, VT (US)

(73) Assignee: Linear Technology Corporation, Milpitas, CA (US)

( * ) Notice: Subject to any disclaimer, the term of this patent is extended or adjusted under 35 U.S.C. 154(b) by 0 days.

(21) Appl. No.: 14/835,549

(22) Filed: Aug. 25, 2015

(65) Prior Publication Data

US 2016/0094362 A1 Mar. 31, 2016

Related U.S. Application Data

(60) Provisional application No. 62/056,240, filed on Sep. 26, 2014.

(51) Int. Cl.
| | |
|---|---|
| *H03K 3/00* | (2006.01) |
| *H04L 12/40* | (2006.01) |
| *H03K 17/16* | (2006.01) |
| *H03K 3/012* | (2006.01) |
| *H03K 17/687* | (2006.01) |
| *H04L 12/12* | (2006.01) |

(52) U.S. Cl.
CPC ......... *H04L 12/40039* (2013.01); *H03K 3/012* (2013.01); *H03K 17/164* (2013.01); *H03K 17/687* (2013.01); *H04L 12/12* (2013.01); *H04L 12/40032* (2013.01); *H04L 2012/40215* (2013.01)

(58) Field of Classification Search
None
See application file for complete search history.

(56) References Cited

U.S. PATENT DOCUMENTS

| 6,051,995 | A  | * | 4/2000  | Pollachek | ............ | H03K 17/164 |
|---|---|---|---|---|---|---|
| | | | | | | 326/27 |
| 7,187,197 | B2 | * | 3/2007  | Tripathi | ........... | H03K 19/00361 |
| | | | | | | 326/29 |
| 7,242,227 | B2 | * | 7/2007  | Pauletti | ................. | H04L 25/085 |
| | | | | | | 327/112 |
| 7,675,329 | B2 | * | 3/2010  | Kiuchi | ...................... | H03F 1/52 |
| | | | | | | 327/108 |
| 2006/0220675 | A1 | | 10/2006 | Tripathi et al. | | |
| 2007/0018695 | A1 | | 1/2007  | Macaluso | | |

FOREIGN PATENT DOCUMENTS

| JP | 2006067543 A | 3/2006 |
|---|---|---|
| JP | 2011142553 A | 7/2011 |
| WO | 9957810 A2 | 11/1999 |

OTHER PUBLICATIONS

EP App No. 15002779.5, "Extended EP Search Report," dated Feb. 15, 2016, 13 pages.

* cited by examiner

*Primary Examiner* — Long Nguyen
(74) *Attorney, Agent, or Firm* — Patent Law Group LLP; Brian D. Ogonowsky

(57) ABSTRACT

A Controller Area Network (CAN) driver (a transmitter) includes a conventional main driver having an open drain first driver MOSFET, for pulling up a first conductor of a bus in a dominant state, and an open drain second driver MOSFET, for pulling down a second conductor of the bus in the dominant state. Since it is difficult to perfectly match the driver MOSFET characteristics for conducting exactly equal currents during turning on and turning off, significant common mode fluctuations occur, resulting in electromagnetic emissions. Source followers are respectively connected in parallel with the first driver MOSFET and the second driver MOSFET for creating a low common mode loading impedance on the conductors during times when the main driver MOSFETs are turning on and turning off to greatly reduce any common mode fluctuations caused by the main driver MOSFETs.

18 Claims, 4 Drawing Sheets

CONTROLLER AREA NETWORK BUS TRANSMITTER WITH COMPLEMENTARY SOURCE FOLLOWER DRIVER

CROSS-REFERENCE TO RELATED APPLICATIONS

This application is based on, and claims priority from, U.S. provisional application 62/056,240, filed on Sep. 26, 2014, by the present inventor, assigned to the present assignee and incorporated herein by reference.

FIELD OF THE INVENTION

This invention relates to Controller Area Network (CAN) bus transmitters and, in particular, to a bus driver that reduces common mode fluctuations.

BACKGROUND

The Controller Area Network (CAN) bus standard ISO 11898 is designed to allow devices to communicate with each other using a 2-wire bus. The ISO 11898 standard is incorporated herein by reference. The data signals on the bus are differential, so any common mode signals are ideally nullified. The standard is primarily applied to communications in vehicles, and examples of devices that may communicate over the bus include engine control units, power steering control units, air bag control units, audio system control units, power window control units, etc. The CAN bus standard may also be applied to industrial environments (e.g., robotic control units), entertainment environments (e.g., video game control units), and other environments.

The various control units typically generate parallel data, and the data is packaged in frames in accordance with a protocol and transmitted serially, as differential bit signals, on the bus. Collision and arbitration rules are specified by the standard.

The present invention only deals with the bus driver (a transmitter) in a CAN, which is typically coupled to a twisted wire pair.

FIG. 1 illustrates a prior art CAN bus driver 10 for a particular device receiving serial data on line 12. In one example, the bus driver 10 receives a logical 0 bit on line 12, and a gate driver 14 generates a low PGATE voltage for turning on a PMOS transistor 16 and generates a high NGATE voltage for turning on an NMOS transistor 18. Thus, Vcc is applied to the high side bus line 20, and system ground is applied to the low side bus line 22. The lines 20 and 22 are coupled to the twisted pair cable 24 (a bus) via optional reverse current-blocking diodes 26 and 28 and the bus terminals CANH and CANL. The voltage differential for a logical 1 bit should be greater than 1.5 volts. This is called a dominant state. For a logical 1 bit on line 12, both transistors 16 and 18 are turned off (a high impedance), and the 120 ohm termination resistors 30 and 32 return the differential voltage on the bus to 0 volts. This is called a recessive state.

Various devices would be coupled to the cable 24 and also include a bus driver similar to the driver 10.

The common mode voltage, which is equal to the average of the CANH and CANL terminal voltages, ideally remains constant during transitions from the recessive state to the dominant state and during transitions from the dominant state back to the recessive state. Fluctuations of the common mode voltage result in electromagnetic emissions (EME), which are undesirable in electronic systems.

During the transition from the recessive state to the dominant state, the PMOS transistor 16 should turn on at exactly the same time and at the same rate as the NMOS transistor 18 in order for the average of the CANH and CANL terminal voltages to remain approximately constant throughout the dominant state. Likewise, during the transition from the dominant state to the recessive state, the PMOS transistor 16 should turn off at exactly the same time and at the same rate as the NMOS transistor 18.

In practical electronic devices, it is very difficult to ensure that two different open drain FETs of different types (PFET vs NFET) turn on and off at exactly the same time and rate. If the two devices do not turn on or off at the same rate, large changes in the common mode voltage may arise during the transitions, resulting in EME. The CAN bus driver 10 is very susceptible to producing large common mode variations. This is because the two transistors 16 and 18 act as high impedance current sources when they are turning on and off, during which their gate to source (Vgs) voltage is low and their drain to source voltage (Vds) is high. Under this condition, the common mode load is the parallel output impedance of these two transistors (plus the parallel impedance of the CAN receivers that are on the CAN bus). This results in a high common mode loading impedance that can be several tens of kilohms. Under these conditions, a small fractional difference in the currents simultaneously conducted by the PMOS transistor 16 and the NMOS transistor 18 during the turn-on or turn-off transitions may result in a common mode voltage fluctuation of a volt or more. This is unacceptable for EME considerations in many systems.

What is needed is a CAN driver that is less affected by the unequal currents conducted by the main driver transistors during the transitions between the dominant and recessive states.

SUMMARY

The invention relates to a CAN bus driver where the main driver transistors are supplemented with complementary source follower drivers. Because the source follower FETs drive their respective CAN bus lines through their sources rather than their drains, their output impedance is very low compared to an open drain driver. The complementary source follower drivers turn on slightly before and turn off slightly after the main driver FETs to provide a much lower common mode loading impedance during the transition between the dominant and recessive states, thereby greatly reducing the common mode voltage fluctuations arising from conduction current mismatches in the main driver FETs.

The source follower driver contains a complementary slope generator circuit that produces two rising and falling waveforms that are equal and opposite to a high degree of matching. Good matching is possible because integrated circuit technology enables highly matched complementary current sources and highly matched capacitors. The complementary rise and fall slopes are generated by switching equal but opposite currents into a pair of matched capacitors.

When the main driver transistors are turned fully on, the bus is driven by the main drive transistors and their respective source followers conducting in parallel.

In another embodiment, similar benefits are achieved if the source follower drivers are switched simultaneously with the main driver FETS, since the low impedance of the source follower driver dominates the switching effects, but such precise timing is relatively difficult in an actual circuit.

DETAILED DESCRIPTION

Figure 1:
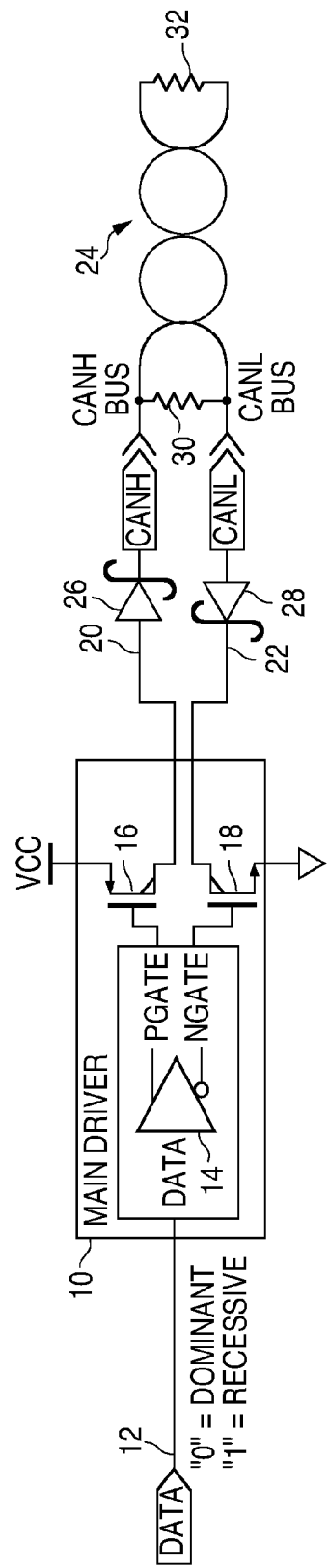
FIG. 1 illustrates a prior art CAN bus driver.
Figure 2:
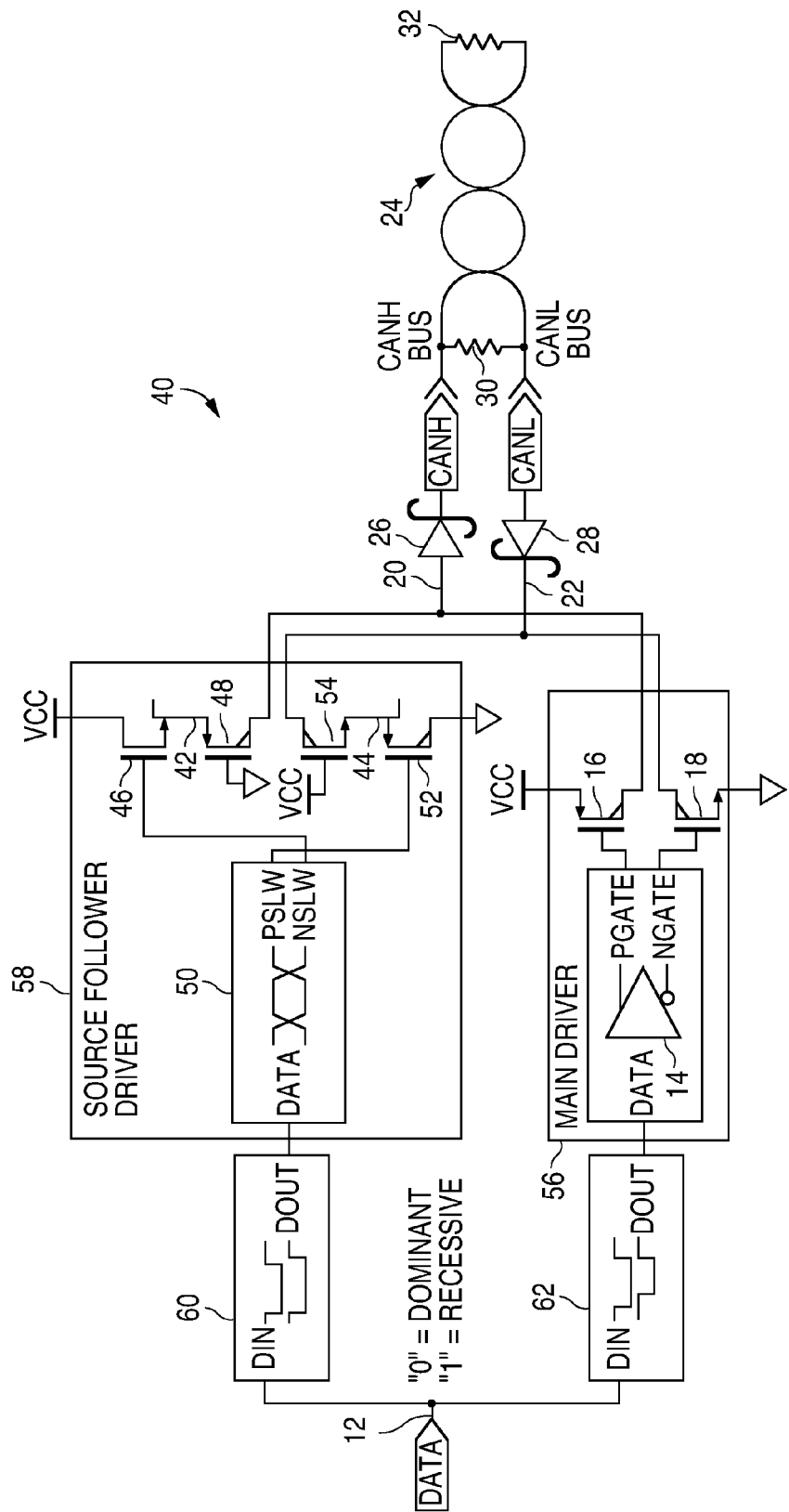
FIG. 2 illustrates a CAN bus driver in accordance with one embodiment of the invention.

FIG. 2 illustrates the improved CAN bus driver 40, where the elements equivalent to those in FIG. 1 are labeled with the same numerals. The driver 40 further includes a pull-up source follower 42 and a pull-down source follower 44.

The pull-up source follower 42 includes an NMOS transistor 46 having its drain coupled to the power supply voltage Vcc and its source coupled to the source of a PMOS transistor 48 acting as a protective high voltage cascode device. The drain of the PMOS transistor 48 is coupled to the high side bus line 20. The gate of the PMOS transistor 48 is coupled to system ground to turn it on, and the gate of the NMOS transistor 46 is coupled to receive a control voltage generated by a slope generator 50.

The pull-down source follower 44 includes a PMOS transistor 52 having its drain coupled to the system ground and its source coupled to the source of an NMOS transistor 54 acting as a protective high voltage cascode device. The drain of the NMOS transistor 54 is coupled to the low side bus line 22. The gate of the NMOS transistor 54 is coupled to the system power supply Vcc to turn it on, and the gate of the PMOS transistor 52 is coupled to receive a control voltage generated by the slope generator 50, where the control voltages for the PMOS transistor 52 and the NMOS transistor 46 are complementary, as shown by the complementary waveforms NSLW (N slew) and PSLW (P slew) within the slope generator 50.

The PMOS transistor 52 is matched with the NMOS transistor 46 so that, as the two transistors turn on or turn off, they conduct approximately identical currents.

The high side bus line 20 is coupled to the drain of the PMOS transistor 16 in the main driver 56, and the low side bus line 22 is coupled to the drain of the NMOS transistor 18 in the main driver 56.

Because the NMOS transistor 46 and the PMOS transistor 52 drive their respective CAN bus lines 20/22 through their sources rather than their drains, their output impedance is very low compared to an open drain driver. The output impedance is low since any change in Vgs caused by a fluctuation on the bus line 20 or 22 produces a large change in current through the transistor.

Since the NMOS transistor 46 and the PMOS transistor 52 are matched and are following the well matched complementary outputs of the slope generator 50, and because their outputs are low impedance voltage sources rather than high impedance current sources, the source followers 42 and 44 produce very little common mode voltage fluctuations when they turn on or turn off. In addition, the source followers 42 and 44 provide a low impedance common mode load on the main driver 56 when the main driver 56 turns on and off.

The much lower common mode loading impedance by the source followers 42 and 44 thereby greatly reduce the common mode voltage fluctuations arising from conduction current mismatches in the main driver 56 transistors 16 and 18 when changing states.

The complementary slope generator 50, considered to be part of the overall source follower driver circuit 58, produces two rising and falling waveforms (NSLW and PSLW) that are equal and opposite to a high degree of matching. Good matching is possible because integrated circuit technology enables highly matched complementary current sources and highly matched capacitors. The complementary rise and fall slopes are generated by switching equal but opposite currents into a pair of matched capacitors.

In order for the source follower driver 58 to provide a common mode load for the main driver 56 during the times when the main driver transistors 16 and 18 are turning on and off, it must turn on slightly before the main driver 56 turns on and turn off slightly after the main driver 56 turns off. This is accomplished by the delay circuits 60 and 62 between the data input line 12 and the inputs of the source follower driver 58 and the main driver 56. The main driver 56 is driven through the delay circuit 62 that delays the leading edge of the data signal (for turning on) but not the trailing edge (for turning off). This is shown by the data input DIN and data output DOUT waveforms within the delay circuit 62. The source follower driver 58 is driven through the delay circuit 60 that delays the trailing edge of the data signal (for turning off) but not the leading edge (for turning on). Upon the arrival of the leading edge of the data signal, the source follower driver 58 turns on immediately, followed shortly after by the main driver 56. Upon the arrival of the falling edge of the data signal, the main driver 56 turns off immediately, followed shortly after by the source follower driver 58. This enables the source follower driver 58 to provide a common mode load to the main driver 56 during its turn on and turn off transitions to reduce common mode voltage fluctuations.

Therefore, ideally, the main driver 56 only switches at times when the source follower driver 58 is in its steady state (whether in recessive or dominant state).

Because the source follower driver 58 is driving the output through source followers 42 and 44, there is a voltage drop between the input voltages on the gates of the NMOS transistor 46 and the PMOS transistor 52 and their outputs. For this reason, the source follower driver 58 is not capable of driving a sufficiently large differential voltage to satisfy the requirements of the CAN bus. Therefore it used as a supplementary driver to improve the EME properties of the main driver 56, which employs the open drain FETs suitable for driving large differential voltages on the CAN bus.

In an alternative embodiment, the high voltage protection cascode transistors 48 and 52 may be deleted. The blocking diodes 26 and 28 may also be deleted, or may be placed at other nodes in the circuit. Further, other techniques can be used for ensuring that the source follower driver 58 turns on before the main driver 56 and turns off after the main driver 56.

In one embodiment, the serial transmission uses a non-return to zero (NRZ) format.

Figure 3:
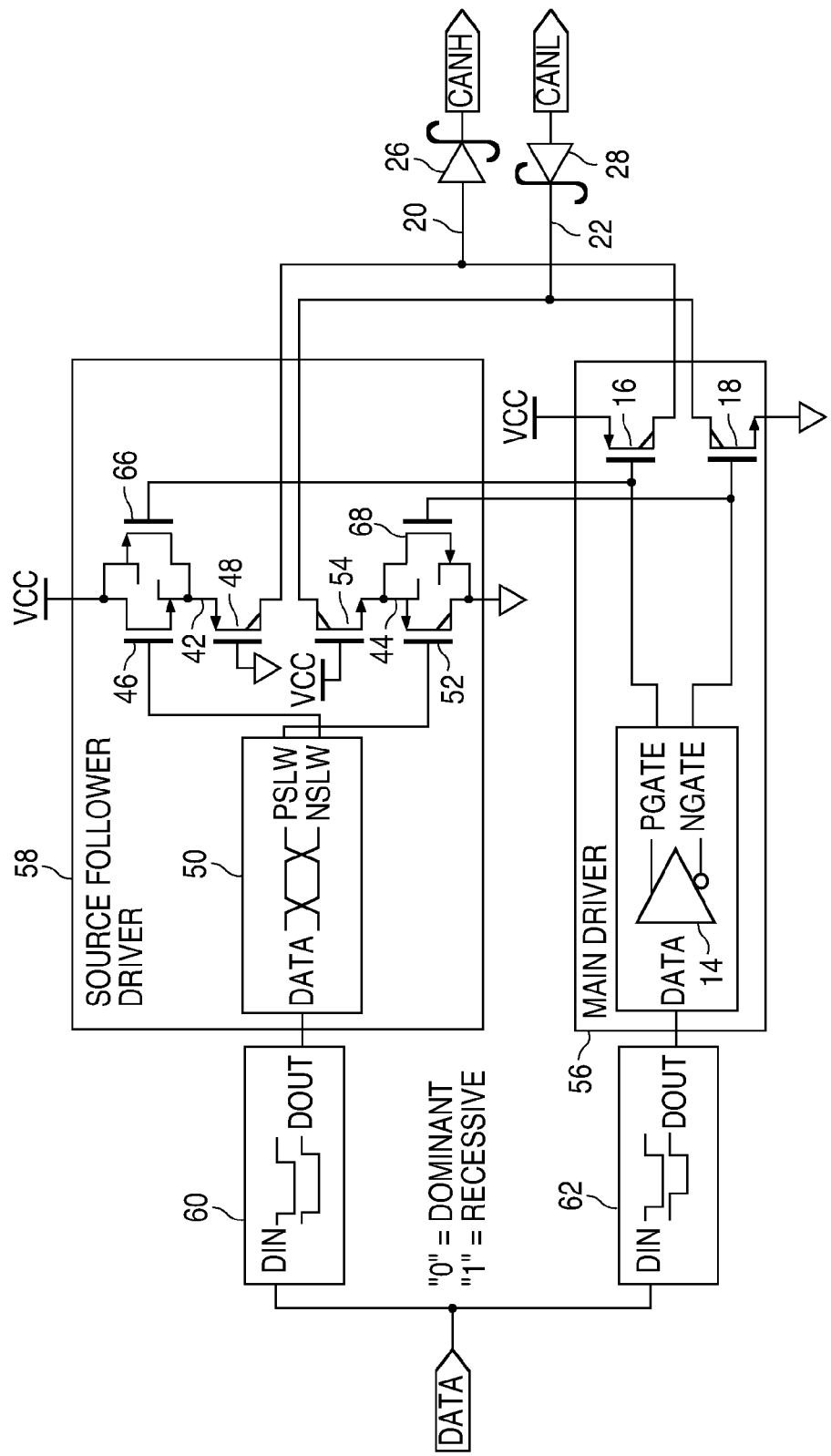
FIG. 3 illustrates a CAN bus driver in accordance with a second embodiment of the invention, where an additional common source FET is connected anti-parallel with each of the source follower FETs to allow the main driver FETs to be made smaller while achieving the same overall output drive current.

FIG. 3 illustrates a second embodiment of the invention. FIG. 3 differs from FIG. 2 in that common source low voltage PMOS transistor 66 and NMOS transistor 68 are connected in anti-parallel with the source follower NMOS transistor 46 and PMOS transistor 52, respectively. PMOS transistor 66 has its source and body connected to the drain of the NMOS transistor 46 and its drain connected to the source and body of the NMOS transistor 46. The gate of the PMOS transistor 66 is driven by the main driver's 56 gate driver 14 in parallel with the main driver PMOS transistor 16 rather than the source follower driver slope generator 50.

Likewise, common source NMOS transistor 68 has its source and body connected to the drain of the PMOS transistor 52 and its drain connected to the source and body of the PMOS transistor 52. The gate of the NMOS transistor 68 is driven by the main driver's 56 gate driver 14 in parallel with main driver NMOS transistor 18 rather than the source follower driver slope generator 50.

The advantage of the embodiment of FIG. 3 is more efficient usage of the chip area devoted to the high voltage transistors 48 and 54 in the source follower driver 58. High voltage FETs are desirable in the output circuit of a CAN transmitter because they provide much greater immunity to damage from electrical fault conditions and electrostatic discharge compared to the conventional low voltage FETs typically used in CMOS integrated circuits. However, high voltage FETs require much greater chip area than low voltage FETs for the same output drive current. In the embodiment shown in FIG. 2, the high voltage cascode transistors 48 and 52 in the source follower driver 58 conduct only during the turn-on and turn-off phases of the signal, and do not contribute to the output drive current when the driver is fully turned on. The main driver 56 pulls up the voltage on the high side bus line 20 high enough to turn off the source follower NMOS transistor 46 and pulls down the voltage on the low side bus line 22 low enough to turn off the source follower PMOS transistor 52. As a result, current through the high voltage cascode transistors 48 and 54 drops to zero during the fully-on state. The considerable chip area devoted to the high voltage cascode transistors 48 and 54 yields a benefit in suppressing the common mode voltage fluctuations but does not contribute to the drive current of the transmitter in its fully on state.

The embodiment of FIG. 3 improves the area efficiency of the transmitter by adding the common source PMOS transistor 66 anti-parallel with the source follower NMOS transistor 46, and adding the common source NMOS transistor 68 anti-parallel with the source follower PMOS transistor 52. The gates of the transistors 66 and 68 are driven by the main driver gate driver 14 in parallel with main driver output transistors 16 and 18 respectively. The transistors 66 and 68 turn on and off at the same time as the main driver transistors 16 and 18 and conduct current through the high voltage cascode transistors 48 and 54. Because they are connected in the common source configuration in parallel with the main driver transistors, their gate to source control voltage are independent of the voltages on the bus lines 20 and 22. The transistors 66 and 68 continue to conduct current through transistors 48 and 54 as the bus line 20 is pulled high and the bus line 22 is pulled low, even as the voltage on these bus lines turn off the source follower transistors 46 and 52. Because the high voltage transistors 54 and 48 now contribute to the drive strength of the transmitter in the fully on state, the size of the main driver transistors 16 and 18 may be reduced while achieving the same output drive current as the embodiment shown in FIG. 2.

Figure 4:
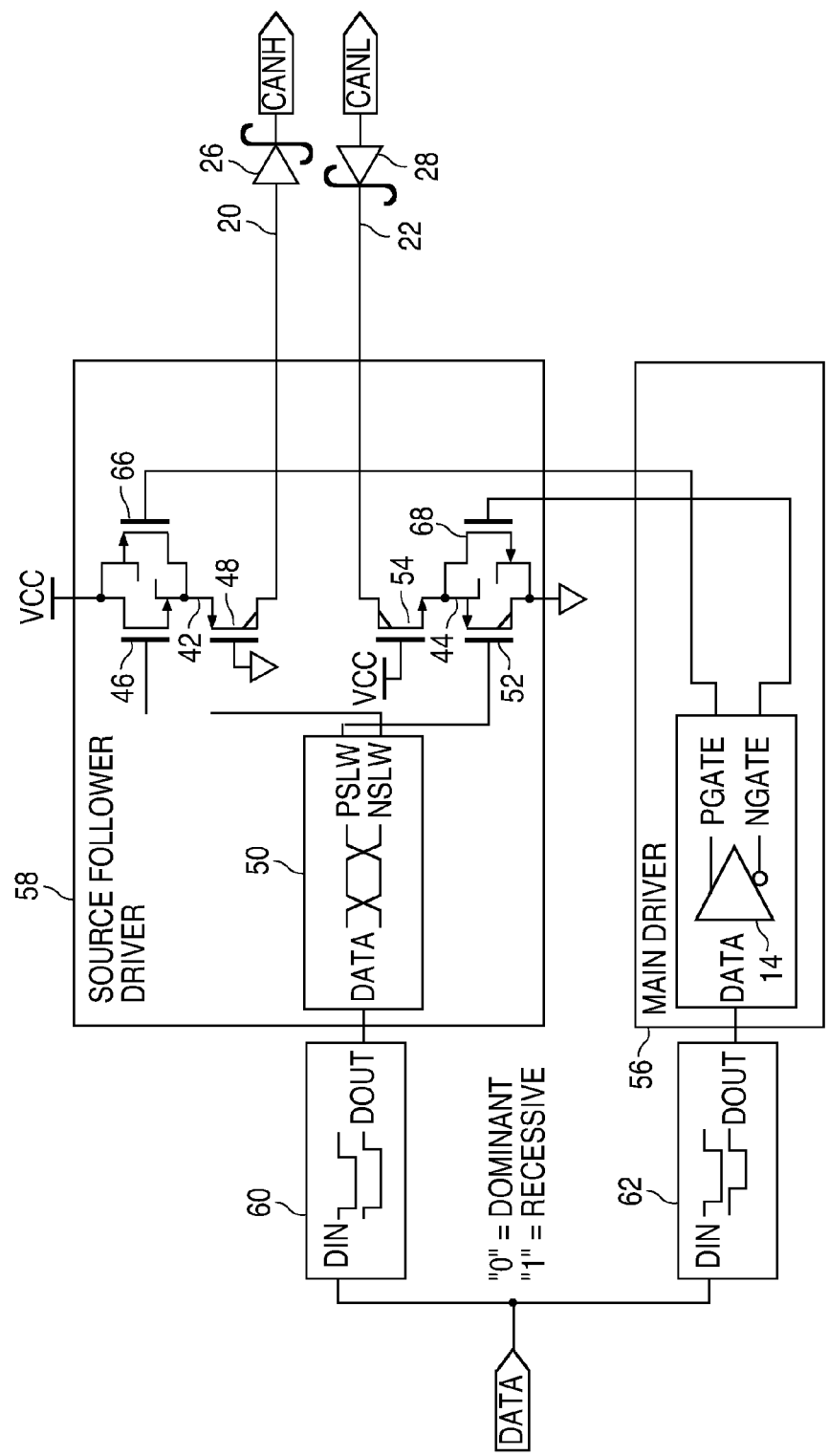
FIG. 4 illustrates a CAN bus driver in accordance with a fourth embodiment of the invention, where the main driver FETs in FIG. 3 are eliminated, while increasing the size of the FETs in the source follower driver to achieve the same overall output drive current.

FIG. 4 illustrates a third embodiment of the invention, which may be used to reduce the driver area, compared to the embodiment of FIG. 2, with a circuit that is simpler than that of FIG. 3. In this embodiment, the high voltage transistors 16 and 18 of the main driver 14 in FIG. 3 are eliminated completely, and the full on-state drive current flows through the common-source low voltage transistors 66 and 68 and their associated optional high voltage cascode transistors 48 and 54. This simplifies the circuit compared to the embodiment shown in FIG. 3 while maintaining some of its advantage of full utilization of the high voltage cascode transistors 48 and 54 for driving the on-state output current. However, the common source transistors 66 and 68 and the high voltage cascode transistors 48 and 54 will have to be made significantly larger than their counterparts in FIG. 3 because they now must drive the full output current in the absence of the main driver transistors 16 and 18. The total FET area may be lower than the embodiment of FIG. 2, with its inefficient use of high voltage cascode transistors 48 and 54, but the total transistor area may be higher than in the embodiment of FIG. 3 because the series combination of transistors 68 and 54 and transistors 66 and 48 will have a higher resistance per unit area than the single transistor 18 and transistor 16 used in the main driver 14 in FIG. 3.

In another embodiment, similar benefits of reducing the common mode voltage fluctuations during transitions between states are achieved if the source follower drivers are switched simultaneously with the main driver FETS, since the low impedance of the source follower drivers dominate the switching effects on the bus lines, but such precise timing of the transitions of the various FETs is relatively difficult in an actual circuit. Thus, in such an embodiment, the delay circuits 60 and 62 are not needed.

While particular embodiments of the present invention have been shown and described, it will be obvious to those skilled in the art that changes and modifications may be made without departing from this invention in its broader aspects. The appended claims are to encompass within their scope all such changes and modifications as fall within the true spirit and scope of this invention.

What is claimed is:

1. A driver for a bus, wherein the bus comprises two conductors, the driver comprising:
   a main driver comprising:
      a first drive MOSFET having a drain coupled to a first conductor of the bus and a source coupled to a first voltage; and
      a second drive MOSFET having a drain coupled to a second conductor of the bus and a source coupled to a second voltage lower than the first voltage,
      wherein a first input data state applied to the main driver causes the first drive MOSFET to pull the first conductor towards the first voltage and causes the second drive MOSFET to pull the second conductor towards the second voltage, and wherein a second data state applied to the main driver causes the first drive MOSFET and the second drive MOSFET to be off so as to be high impedances; and
   a source follower circuit comprising:
      a first source follower MOSFET having a source coupled to the first conductor and a drain coupled to the first voltage; and
      a second source follower MOSFET having a source coupled to the second conductor and a drain coupled to the second voltage,
      wherein the first input data state applied to the source follower circuit causes the first source follower MOSFET to pull the first conductor towards the first voltage and causes the second source follower MOSFET to pull the second conductor towards the second voltage, and wherein the second data state causes the first source follower MOSFET and the second source follower MOSFET to be off so as to be high impedances, wherein the first source follower MOSFET and the second source follower MOSFET are controlled to turn on simultaneously with or prior to the first drive MOSFET and the second drive MOSFET turning on, and wherein the first source follower MOSFET and the second source follower MOSFET are controlled to turn off simultaneously with the first drive MOSFET and the second drive MOSFET turning off or after the first drive MOSFET and the second drive MOSFET have turned off.

2. The driver of claim 1 wherein the first source follower MOSFET and the second source follower MOSFET are controlled to turn on prior to the first drive MOSFET and the second drive MOSFET turning on, and wherein the first source follower MOSFET and the second source follower MOSFET are controlled to turn off after the first drive MOSFET and the second drive MOSFET have turned off.

3. The driver of claim 1 wherein the first source follower MOSFET has its source coupled to the first conductor via a first cascode MOSFET, and wherein the second source follower MOSFET has its source coupled to the first conductor via a second cascode MOSFET.

4. The driver of claim 1 wherein the first source follower MOSFET and the first drive MOSFET are coupled to the first conductor via a first diode, and wherein the second source follower MOSFET and second drive MOSFET are coupled to the second conductor via a second diode.

5. The driver of claim 1 further comprising:
a first delay circuit for the source follower circuit, the first delay circuit receiving a data signal, wherein the first delay circuit delays a turning off of the first source follower MOSFET and the second source follower MOSFET; and
a second delay circuit for the main driver, the second delay circuit receiving the data signal, wherein the second delay circuit delays a turning on of the first drive MOSFET and the second drive MOSFET.

6. The driver of claim 1 wherein the driver is a Controller Area Network bus driver.

7. The driver of claim 1 wherein the first conductor and the second conductor comprise a twisted pair of wires.

8. The driver of claim 1 further comprising:
a main gate drive circuit receiving an input data signal and outputting a first gate drive voltage to the first drive MOSFET and outputting a complementary second gate drive voltage to the second drive MOSFET;
a third MOSFET connected in anti-parallel with the first source follower MOSFET, wherein a drain of the third MOSFET is connected to the source of the first source follower MOSFET, wherein a source of the third MOSFET is connected to the drain of the first source follower MOSFET, and wherein a gate of the third MOSFET is connected to receive the first gate drive voltage, such that the third MOSFET has the same state as the first drive MOSFET; and
a fourth MOSFET connected in anti-parallel with the second source follower MOSFET, wherein a drain of the fourth MOSFET is connected to the source of the second source follower MOSFET, wherein a source of the fourth MOSFET is connected to the drain of the second source follower MOSFET, and wherein a gate of the fourth MOSFET is connected to receive the second gate drive voltage, such that the fourth MOSFET has the same state as the second drive MOSFET.

9. A driver for a bus, wherein the bus comprises a first conductor and a second conductor, the driver comprising:
a first drive MOSFET coupled to the first conductor of the bus;
a second drive MOSFET coupled to the second conductor of the bus;
a main gate drive circuit driving the first drive MOSFET and the second drive MOSFET, the main gate drive circuit receiving an input data signal and outputting a first gate drive voltage and a complementary second gate drive voltage, wherein a first input data state applied to the main gate drive circuit causes the first conductor to be pulled towards a first voltage and causes the second conductor to be pulled towards a second voltage, and wherein a second data state applied to the main gate drive circuit provides a high impedance on the first conductor and second conductor;
a source follower circuit comprising:
a first source follower MOSFET having a source coupled to the first conductor and a drain coupled to the first voltage; and
a second source follower MOSFET having a source coupled to the second conductor and a drain coupled to the second voltage,
wherein the first input data state applied to the source follower circuit causes the first source follower MOSFET to pull the first conductor towards the first voltage and causes the second source follower MOSFET to pull the second conductor towards the second voltage, and wherein the second data state causes the first source follower MOSFET and the second source follower MOSFET to be off so as to be high impedances;
a third MOSFET connected in anti-parallel with the first source follower MOSFET, wherein a drain of the third MOSFET is connected to the source of the first source follower MOSFET, wherein a source of the third MOSFET is connected to the drain of the first source follower MOSFET, and wherein a gate of the third MOSFET is connected to receive the first gate drive voltage, such that the third MOSFET has the same state as the first drive MOSFET; and
a fourth MOSFET connected in anti-parallel with the second source follower MOSFET, wherein a drain of the fourth MOSFET is connected to the source of the second source follower MOSFET, wherein a source of the fourth MOSFET is connected to the drain of the second source follower MOSFET, and wherein a gate of the fourth MOSFET is connected to receive the second gate drive voltage, such that the fourth MOSFET has the same state as the second drive MOSFET.

10. The driver of claim 9 further comprising:
a first delay circuit for the source follower circuit, the first delay circuit receiving the input data signal, wherein the first delay circuit delays a turning off of the first source follower MOSFET and the second source follower MOSFET, such that the first source follower MOSFET and the second source follower MOSFET remain on for a time after the third MOSFET and the fourth MOSFET have turned off; and
a second delay circuit for the main gate drive circuit, the second delay circuit receiving the input data signal, wherein the second delay circuit delays a turning on of the third MOSFET and the fourth MOSFET, such that the first source follower MOSFET and the second source follower MOSFET turn on before the third MOSFET and the fourth MOSFET turn on.

11. The driver of claim 9 wherein the first source follower MOSFET has its source coupled to the first conductor via a first cascode MOSFET, and wherein the second source follower MOSFET has its source coupled to the first conductor via a second cascode MOSFET.

12. The driver of claim 9 wherein the driver is a Controller Area Network bus driver.

13. The driver of claim 9 wherein the first conductor and the second conductor comprise a twisted pair of wires.

14. A method for controlling a driver for a bus, wherein the bus comprises a first conductor and a second conductor, the method comprising:
receiving an input data signal by a main gate drive circuit;
outputting from the main gate drive circuit a first gate drive voltage to a first drive MOSFET, the first drive MOSFET being coupled between a first voltage and the first conductor, and outputting a complementary second gate drive voltage to a second drive MOSFET, the second drive MOSFET being coupled between a second voltage and the second conductor; and
providing a source follower circuit having a first source follower MOSFET with a source coupled to the first conductor and a drain coupled to the first voltage; and a second source follower MOSFET with a source coupled to the second conductor and a drain coupled to the second voltage,
wherein a first input data state causes the first source follower MOSFET and the first drive MOSFET to pull the first conductor towards the first voltage and causes the second source follower MOSFET and the second drive MOSFET to pull the second conductor towards the second voltage, and wherein a second data state causes the first source follower MOSFET, the first drive MOSFET, the second source follower MOSFET, and the second drive MOSFET to be off so as to be high impedances.

15. The method of claim 14 further comprising:
receiving the input data signal by a first delay circuit for the source follower circuit, wherein the first delay circuit delays a turning off of the first source follower MOSFET and the second source follower MOSFET, such that the first source follower MOSFET and the second source follower MOSFET remain on for a time after the first drive MOSFET and the second drive MOSFET have turned off; and
receiving the input data signal by a second delay circuit for the main gate drive circuit, wherein the second delay circuit delays a turning on of the first drive MOSFET and the second drive MOSFET, such that the first source follower MOSFET and the second source follower MOSFET turn on before the first drive MOSFET and the second drive MOSFET turn on.

16. The method of claim 14 wherein the first drive MOSFET is connected in anti-parallel with the first source follower MOSFET, wherein a drain of the first drive MOSFET is connected to the source of the first source follower MOSFET, wherein a source of the first drive MOSFET is connected to the drain of the first source follower MOSFET, and wherein a gate of the first drive MOSFET is connected to receive the first gate drive voltage, and
wherein the second drive MOSFET is connected in anti-parallel with the second source follower MOSFET, wherein a drain of the second drive MOSFET is connected to the source of the second source follower MOSFET, wherein a source of the second drive MOSFET is connected to the drain of the second source follower MOSFET, and wherein a gate of the second drive MOSFET is connected to receive the second gate drive voltage.

17. The method of claim 14 wherein the first source follower MOSFET and the first drive MOSFET have their source and drain respectively coupled to the first conductor via a first cascode MOSFET, and wherein the second source follower MOSFET and the second drive MOSFET have their source and drain respectively coupled to the first conductor via a second cascode MOSFET.

18. The method of claim 14 wherein the driver is a Controller Area Network bus driver.

* * * * *